(12) United States Patent
Demura et al.

(10) Patent No.: US 12,165,886 B2
(45) Date of Patent: Dec. 10, 2024

(54) SUBSTRATE PROCESSING APPARATUS AND SUBSTRATE PROCESSING METHOD

(71) Applicant: SHIBAURA MECHATRONICS CORPORATION, Kanagawa (JP)

(72) Inventors: Kensuke Demura, Kanagawa (JP); Daisuke Matsushima, Kanagawa (JP); Masaya Kamiya, Kanagawa (JP)

(73) Assignee: SHIBAURA MECHATRONICS CORPORATION, Kanagawa (JP)

( * ) Notice: Subject to any disclaimer, the term of this patent is extended or adjusted under 35 U.S.C. 154(b) by 53 days.

(21) Appl. No.: 17/460,566

(22) Filed: Aug. 30, 2021

(65) Prior Publication Data
US 2022/0068671 A1 Mar. 3, 2022

(30) Foreign Application Priority Data

Aug. 31, 2020 (JP) .................................. 2020-145915
Jun. 28, 2021 (JP) .................................. 2021-106704

(51) Int. Cl.
*H01L 21/67* (2006.01)
*H01L 21/687* (2006.01)

(52) U.S. Cl.
CPC .. *H01L 21/67051* (2013.01); *H01L 21/67109* (2013.01); *H01L 21/68764* (2013.01)

(58) Field of Classification Search
CPC .............................................. H01L 21/67109
See application file for complete search history.

(56) References Cited

U.S. PATENT DOCUMENTS

2018/0047559 A1* 2/2018 Kamiya ............ H01L 21/67051
2018/0182645 A1* 6/2018 Nakano ............ H01L 21/67051

FOREIGN PATENT DOCUMENTS

JP       2008159656 A  *  7/2008  ....... H01L 21/02041
JP       2018-026436 A     2/2018

OTHER PUBLICATIONS

Machine translation: JP2008159656; Fujiwara et al. (Year: 2008).*

* cited by examiner

*Primary Examiner* — Natasha N Campbell
(74) *Attorney, Agent, or Firm* — Venjuris, P.C.

(57) ABSTRACT

A substrate processing apparatus according to an embodiment of the present disclosure includes: a stage; a plurality of holders configured to hold a substrate; a liquid supply configured to supply a liquid to a surface of the substrate opposite to the stage; a cooler configured to supply a cooling gas to a space between the stage and the substrate; a mover configured to change a distance between the stage and the substrate; and a controller configured to control the cooler and the mover. The controller performs a cooling process that at least includes a supercooling process and a freezing process (solid-liquid phase), and a thawing process after the cooling process. In the cooling process, the controller controls the mover to set the distance to a first distance, and in the thawing process, the controller controls the mover to set the distance to a second distance longer than the first distance.

14 Claims, 6 Drawing Sheets

SUBSTRATE PROCESSING APPARATUS AND SUBSTRATE PROCESSING METHOD

CROSS-REFERENCE TO RELATED APPLICATIONS

This application is based on and claims priority from Japanese Patent Application Nos. 2020-145915 and 2021-106704, filed on Aug. 31, 2020 and Jun. 28, 2021, respectively, with the Japan Patent Office, the disclosures of which are incorporated herein in their entireties by reference.

TECHNICAL FIELD

The present disclosure relates to a substrate processing apparatus and a substrate processing method.

BACKGROUND

In a microstructure such as an imprinting template, a photolithography mask substrate, and a semiconductor wafer, fine uneven portions are formed on the surface of the substrate.

Here, as for a method of removing contaminants such as particles that adhere to the surface of the substrate, an ultrasonic cleaning method or a two-fluid spray cleaning method is known. However, when ultrasonic waves are applied to the substrate or a fluid is sprayed onto the surface of the substrate, the fine uneven portions formed on the surface of the substrate may be damaged. Further, in recent years, the uneven portions have become finer, and thus, are more likely to be damaged.

Accordingly, as for the method of removing the contaminants that adhere to the surface of the substrate, a freeze-cleaning method has been proposed.

In the freeze-cleaning method, the surface of the substrate is cleaned according to the following process. First, pure water is supplied to the surface of the substrate that is being rotated, and a part of the pure water supplied to the surface is discharged to form a water film on the surface of the substrate. Next, a cooling gas is supplied to the substrate on which the water film is formed, to freeze the water film. When the water film is frozen so that an ice film is formed, the contaminants are incorporated into the ice film, and thereby being separated from the surface of the substrate. Next, pure water is supplied to the ice film to melt the ice film, and the contaminants are removed from the surface of the substrate together with the pure water. Then, the substrate from which the pure water and the contaminants have been removed is dried by being rotated.

Here, when the cooling gas is supplied to the surface of the substrate on which the water film is formed, to freeze the water film, the freezing starts from the front surface of the water film (opposite to the back surface thereof that faces the substrate). When the freezing starts from the front surface of the water film, it may become difficult to separate impurities adhering to the surface of the substrate from the surface of the substrate. Thus, a technique has been proposed which supplies the cooling gas to the opposite surface of the substrate to the surface thereof on which the water film is formed (see, e.g., Japanese Patent Laid-Open Publication No. 2018-026436).

However, in the step of forming the ice film, when the cooling gas is supplied to the opposite surface of the substrate to the surface thereof on which the water film is formed, a stage on which the substrate is placed is also cooled by the cooling gas. In the step of melting the ice film and the step of drying the substrate that are performed after the step of forming the ice film, the supply of the cooling gas is stopped, but the temperature of the stage remains low for a certain time period. In the step of melting the ice film or the step of drying the substrate, when the temperature of the stage is relatively low, the amount of heat transferred from the substrate to the stage may increase due to a radiation, and thus, the substrate may be cooled.

Further, the air around the stage may be cooled due to the stage, and the substrate may be cooled due to the cooled air.

When the substrate is cooled, a dew condensation may occur on the front or back surface of the substrate, which may cause a contamination, watermarks or the like.

Thus, there has been a demand to develop a technique capable of suppressing the occurrence of dew condensation on the substrate.

SUMMARY

An object of the present disclosure is to provide a substrate processing apparatus and a substrate processing method which are capable of suppressing the occurrence of dew condensation on a substrate.

A substrate processing apparatus according to an embodiment of the present disclosure includes: a stage provided to be rotatable; a plurality of holders provided to face one surface of the stage and configured to hold a substrate; a liquid supply configured to supply a liquid having a temperature higher than a freezing point to a surface of the substrate opposite to the stage; a cooling unit configured to supply a cooling gas to a space between the stage and the substrate; a moving unit configured to change a distance between the stage and the substrate held by the plurality of the holders; and a controller configured to control the cooling unit and the moving unit. The controller performs: a cooling process that at least includes a supercooling process of bringing the liquid on the substrate into a supercooled state from the temperature higher than the freezing point and a freezing process (solid-liquid phase) progressed from the supercooled state until a completion of a freezing; and a thawing process after the cooling process. In the cooling process, the controller controls the moving unit to set the distance to a first distance, and in the thawing process, the controller controls the moving unit to set the distance to a second distance longer than the first distance.

Embodiments of the present disclosure provide a substrate processing apparatus and a substrate processing method, which are capable of suppressing the occurrence of dew condensation on a substrate.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENTS

Figure 1:
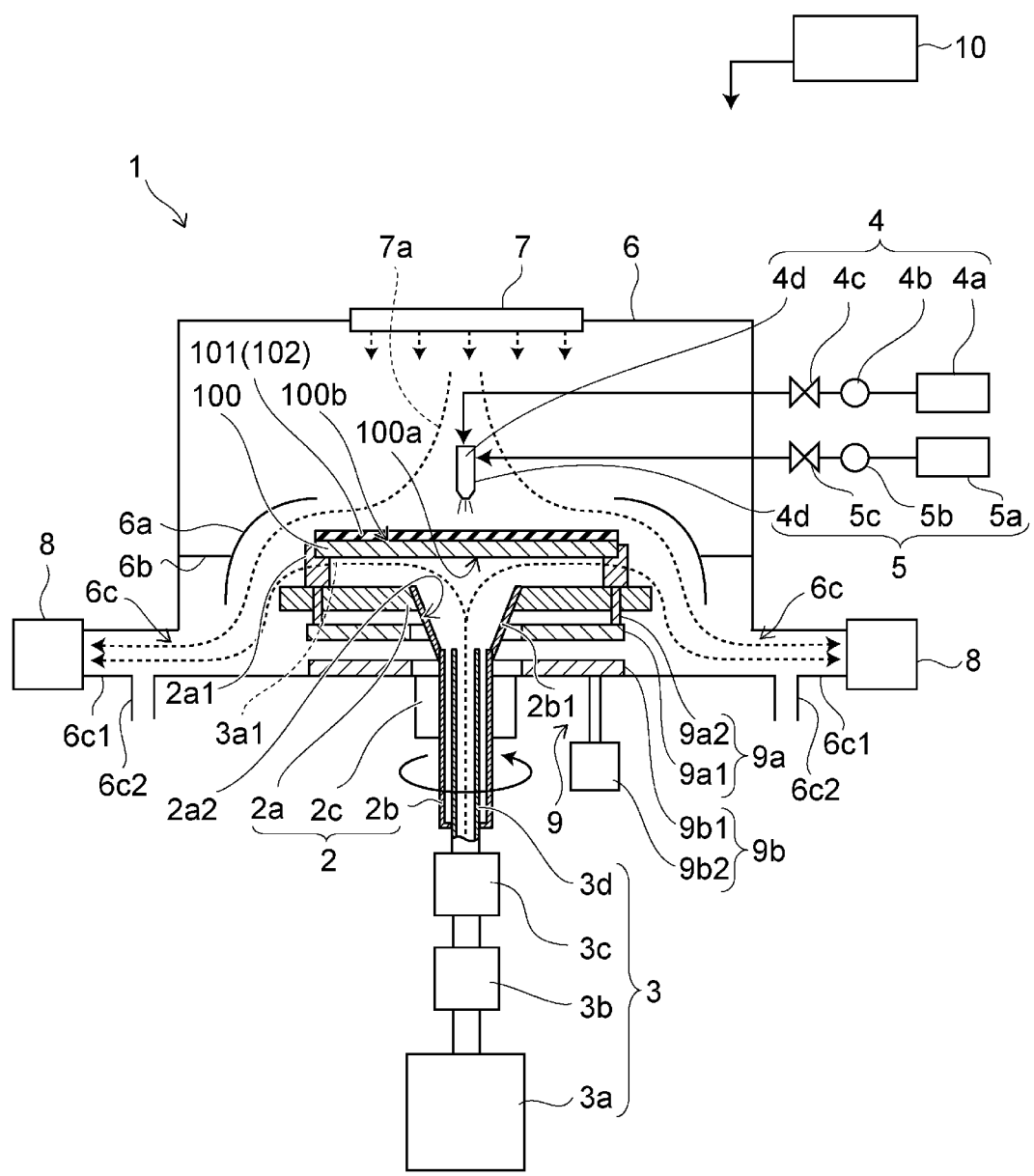
FIG. 1 is a schematic view illustrating a substrate processing apparatus according to an embodiment of the present disclosure.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, embodiments will be described with reference to the drawings. In the respective drawings, the same components will be denoted by the same reference numerals, and detailed descriptions thereof will be appropriately omitted.

A substrate 100 described herein below may be, for example, a semiconductor wafer, an imprinting template, a photolithography mask substrate, or a plate-like body used for a micro electro mechanical system (MEMS).

However, the application of the substrate 100 is not limited to the examples described above.

FIG. 1 is a schematic view illustrating a substrate processing apparatus 1 according to an embodiment of the present disclosure.

As illustrated in FIG. 1, the substrate processing apparatus 1 includes a placing unit 2, a cooling unit 3, a first liquid supply unit 4, a second liquid supply unit 5, a housing 6, a blowing unit 7, an exhaust unit 8, a moving unit 9, and a controller 10.

The placing unit 2 includes a stage 2a, a rotary shaft 2b, and a driving unit 2c.

The stage 2a has a plate shape and is rotatably provided inside the housing 6. A plurality of holders 2a1 is provided on one main surface of the stage 2a to hold the substrate 100. When the substrate 100 is held by the plurality of holders 2a1, the front surface 100b of the substrate 100 (the surface on which a cleaning is performed) faces the direction opposite to the stage 2a.

A liquid-repellent film (corresponding to an example of a first (e.g., film-shape) liquid repellent) may be provided on at least one of the upper surface of the stage 2a and the side of the holders 2a1 that faces the stage 2a. The liquid-repellent film has the property of more easily repelling a liquid 101 (liquid repellency) than the stage 2a. The liquid-repellent film may be formed of, for example, a material having a functional group such as a saturated fluoroalkyl group (e.g., a trifluoromethyl group), a fluorosilyl group, an alkylsilyl group, or a long-chain alkyl group. For example, the liquid-repellent film may be formed by coating the upper surface of the stage 2a with a fluororesin (see, e.g., a liquid repellent 2a3 in FIG. 8).

One end of the rotary shaft 2b is fitted into a hole 2a2 of the stage 2a. The other end of the rotary shaft 2b is provided outside the housing 6. The rotary shaft 2b is connected to the driving unit 2c outside the housing 6.

The rotary shaft 2b has a tubular shape. A blow-out portion 2b1 is provided at the end of the rotary shaft 2b to face the stage 2a. The blow-out portion 2b1 is opened at the surface of the stage 2a that faces the substrate 100. The end of the blow-out portion 2b1 that faces the opening is connected to the inner wall of the hole 2a2. The opening of the blow-out portion 2b1 faces the back surface 100a of the substrate 100 placed on the stage 2a.

While descriptions are made on a case where the blow-out portion 2b1 is provided at the tip of the rotary shaft 2b, the blow-out portion 2b1 may be provided at the tip of a cooling nozzle 3d to be described later. Further, the hole 2a2 of the stage 2a may serve as the blow-out portion 2b1.

The end of the rotary shaft 2b opposite to the stage 2a is closed. The cooling nozzle 3d is inserted from the end of the rotary shaft 2b opposite to the stage 2a. A rotary shaft seal (not illustrated) is provided between the end of the rotary shaft 2b opposite to the stage 2a and the cooling nozzle 3d.

The driving unit 2c is provided outside the housing 6. The driving unit 2c is connected to the rotary shaft 2b. Further, the driving unit 2c is fixed to the housing 6. The driving unit 2c may include a rotating device such as a motor. The rotational force of the driving unit 2c is transmitted to the stage 2a via the rotary shaft 2b. Thus, the driving unit 2c is able to rotate the stage 2a, and furthermore, the substrate 100 placed on the stage 2a.

Further, the driving unit 2c may change the number of rotation times (rotation speed), in addition to the starting and stopping the rotation. The driving unit 2c may be provided with, for example, a control motor such as a servo motor.

The cooling unit 3 supplies a cooling gas 3a1 to the space between the stage 2a and the substrate 100.

The cooling unit 3 includes a coolant unit 3a, a filter 3b, a flow rate control unit 3c, and the cooling nozzle 3d. The coolant unit 3a, the filter 3b, and the flow rate control unit 3c are provided outside the housing 6.

The coolant unit 3a stores a coolant and generates the cooling gas 3a1. The coolant is obtained by liquefying the cooling gas 3a1. The cooling gas 3a1 is not particularly limited and may be any gas that hardly reacts with the material of the substrate 100. The cooling gas 3a1 may be, for example, an inert gas such as nitrogen gas, helium gas, or argon gas. In this case, the time for cooling the substrate 100 may be reduced by using a gas having a relatively high specific heat. For example, the time for cooling the substrate 100 may be reduced by using helium gas. In addition, the processing cost of the substrate 100 may be reduced by using nitrogen gas.

The coolant unit 3a includes a tank that stores the coolant, and a vaporizer that vaporizes the coolant stored in the tank. A cooling device is provided in the tank to maintain the temperature of the coolant. The vaporizer increases the temperature of the coolant, to generate the cooling gas 3a1 from the coolant. Since the inside of the tank is filled with the coolant and the cooling gas 3a1, the cooling gas 3a1 does not contain water. The temperature of the cooling gas 3a1 may be a temperature at which the liquid 101 may be cooled to a temperature equal to or lower than the freezing point to be brought into a supercooled state. Thus, the temperature of the cooling gas 3a1 may be a temperature equal to or lower than the freezing point of the liquid 101. The temperature of the cooling gas 3a1 may be, for example, −170° C.

The filter 3b is connected to the coolant unit 3a via a pipe. The filter 3b suppresses the outflow of contaminants such as particles contained in the coolant toward the substrate 100.

The flow rate control unit 3c is connected to the filter 3b via a pipe. The flow rate control unit 3c controls the flow rate of the cooling gas 3a1. The temperature of the cooling gas 3a1 generated from the coolant in the coolant unit 3a is substantially set to a predetermined temperature. Thus, by controlling the flow rate of the cooling gas $3a1$, the flow rate control unit $3c$ may control the temperature of the substrate 100, and furthermore, the temperature of the liquid 101 on the substrate 100.

The flow rate control unit $3c$ may be, for example, a mass flow controller (MFC). Further, the flow rate control unit $3c$ may indirectly control the flow rate of the cooling gas $3a1$ by controlling the supply pressure of the cooling gas $3a1$. In this case, the flow rate control unit $3c$ may be, for example, an auto pressure controller (APC).

The cooling nozzle $3d$ has a tubular shape. One end of the cooling nozzle $3d$ is connected to the flow control unit $3c$. The other end of the cooling nozzle $3d$ is provided inside the rotary shaft $2b$. The cooling nozzle $3d$ supplies the cooling gas $3a1$ of which the flow rate is controlled by the flow rate control unit $3c$, to the substrate 100. The cooling gas $3a1$ discharged from the cooling nozzle $3d$ is directly supplied to the surface of the substrate 100 opposite to the surface thereof to which the liquid 101 is supplied, through the blow-out portion $2b1$.

The first liquid supply unit 4 supplies the liquid 101 to the surface of the substrate 100 (the front surface $100b$) opposite to the surface thereof that faces the stage $2a$. The liquid 101 may be, for example, water (e.g., pure water or ultrapure water) or a liquid that contains water as a main component. The liquid that contains water as a main component may be, for example, a mixed liquid of water and alcohol, a mixed liquid of water and an acidic solution, or a mixed liquid of water and an alkaline solution. In this case, when the amount of a component other than water is excessively large, it may become difficult to utilize the physical force generated from a volume increase to be described later. Thus, the concentration of a component other than water may be 5 wt % or more and 30 wt % or less. Further, a gas may be dissolved in the liquid 101. The gas may be, for example, carbon dioxide gas, ozone gas, or hydrogen gas. The temperature of the liquid 101 may be, for example, about room temperature (20° C.).

The first liquid supply unit 4 includes a liquid storage unit $4a$, a supply unit $4b$, a flow rate control unit $4c$, and a liquid nozzle $4d$. The liquid storage unit $4a$, the supply unit $4b$, and the flow rate control unit $4c$ are provided outside the housing 6.

The liquid storage unit $4a$ stores the liquid 101.

The supply unit $4b$ is connected to the liquid storage unit $4a$ via a pipe. The supply unit $4b$ supplies the liquid 101 stored in the liquid storage unit $4a$ toward the liquid nozzle $4d$.

The flow rate control unit $4c$ is connected to the supply unit $4b$ via a pipe. The flow rate control unit $4c$ controls the flow rate of the liquid 101 supplied by the supply unit $4b$. The flow rate control unit $4c$ may be, for example, a flow rate control valve. Further, the flow rate control unit $4c$ may also start and stop the supply of the liquid 101.

The liquid nozzle $4d$ is provided inside the housing 6. The liquid nozzle $4d$ has a tubular shape. One end of the liquid nozzle $4d$ is connected to the flow rate control unit $4c$ via a pipe. The other end of the liquid nozzle $4d$ faces the front surface $100b$ of the substrate 100 placed on the stage $2a$. Further, the other end of the liquid nozzle $4d$ (an ejection hole of the liquid 101) is disposed above substantially the center of the front surface $100b$ of the substrate 100.

The second liquid supply 5 supplies a liquid 102 to the front surface $100b$ of the substrate 100. The liquid 102 is used in a thawing step to be described later. Thus, the liquid 102 is not particularly limited, and may be any liquid that hardly reacts with the material of the substrate 100 and hardly remains on the substrate 100 in a drying step to be described later. The liquid 102 may be, for example, water (e.g., pure water or ultrapure water) or a mixed liquid of water and alcohol.

The second liquid supply unit 5 includes a liquid storage unit $5a$, a supply unit $5b$, a flow rate control unit $5c$, and the liquid nozzle $4d$.

The liquid storage unit $5a$ may be the same as the liquid storage unit $4a$ described above. The supply unit $5b$ may be the same as the supply unit $4b$ described above. The flow rate control unit $5c$ may be the same as the flow rate control unit $4c$ described above.

When the liquid 102 is the same as the liquid 101, the second liquid supply unit 5 may be omitted. Further, while descriptions are made on a case where the liquid nozzle $4d$ is shared, a liquid nozzle for ejecting the liquid 101 and a liquid nozzle for ejecting the liquid 102 may be separately provided. The temperature of the liquid 102 may be, for example, about room temperature (20° C.).

The housing 6 has a box shape. A cover $6a$ is provided inside the housing 6. The cover $6a$ receives the liquid 101 (102) supplied to the substrate 100 and discharged to the outside of the substrate 100 due to the rotation of the substrate 100. Further, a partition plate $6b$ is provided inside the housing 6. The partition plate $6b$ is provided between the outer surface of the cover $6a$ and the inner surface of the housing 6.

A discharge port $6c$ is provided in the side surface of the housing 6 close to the bottom surface thereof. The used cooling gas $3a1$, air $7a$, and liquid 101 (102) are discharged from the discharge port $6c$ to the outside of the housing 6. An exhaust pipe $6c1$ is connected to the discharge port $6c$, and an exhaust unit (pump) 8 is connected to the exhaust pipe $6c1$ to exhaust the used cooling gas $3a1$ and air $7a$. Further, a discharge pipe $6c2$ is connected to the discharge port $6c$ to discharge the liquid 101 (102).

The blowing unit 7 is provided on the ceiling surface of the housing 6. The blowing unit 7 may be provided on the side surface of the housing 6 close to the ceiling thereof. The blowing unit 7 may be provided with a blower such as a fan, and a filter. The blowing unit 7 supplies the air $7a$ (outside air) to the space between the partition plate $6b$ and the ceiling of the housing 6. Thus, the pressure in the space between the partition plate $6b$ and the ceiling of the housing 6 becomes higher than the pressure outside the housing 6. As a result, the air $7a$ supplied by the blowing unit 7 may be easily guided to the discharge port $6c$. Further, contaminants such as particles may be suppressed from entering the housing 6 from the discharge port $6c$.

The moving unit 9 moves the positions of the plurality of holders $2a1$ with respect to the stage $2a$, and furthermore, the position of the substrate 100 with respect to the stage $2a$. That is, the moving unit 9 changes the distance between the stage $2a$ and the substrate 100 held by the plurality of holders $2a1$.

The moving unit 9 may include a support $9a$ and a lift $9b$.

The support $9a$ may be provided inside the housing 6. The plurality of holders $2a1$ are provided on the support $9a$.

The support $9a$ may include a base $9a1$ (corresponding to an example of a first base) and a column $9a2$.

The base $9a1$ has an annular shape, and may be provided to face the surface of the stage $2a$ opposite to the surface thereof on which the plurality of holders $2a1$ are provided. The base $9a1$ may be provided substantially in parallel to the stage $2a$. For example, in the central region of the base $9a1$, a hole is formed penetrating the base $9a1$ in the thickness direction, and the rotary shaft 2*b* is provided in the hole with a predetermined gap. While the annular base 9*a*1 is described, the shape of the base 9*a*1 is not limited thereto. For example, the hole that penetrates the base 9*a*1 in the thickness direction may be opened at the side surface of the base 9*a*1. For example, the planar shape of the base 9*a*1 may be a C- or U-shape. The base 9*a*1 has only to be provided outside the rotary shaft 2*b* with a predetermined gap.

The base 9*a*1 may have a magnetism. At least the portion of the base 9*a*1 opposite to the stage 2*a* has the magnetism. In this case, a permanent magnet may be provided on the portion of the base 9*a*1 opposite to the stage 2*a*, or the base 9*a*1 may be magnetized.

The column 9*a*2 may be provided for each of the plurality of holders 2*a*1. The column 9*a*2 has a columnar shape, one end thereof is connected to the holder 2*a*1, and the other end thereof is connected to the base 9*a*1. The column 9*a*2 is provided to be movable in the thickness direction of the stage 2*a*. For example, the column 9*a*2 may be provided inside a hole, a groove, or a notch that penetrates the stage 2*a* in the thickness direction. The length dimension of the column 9*a*2 may be made larger than the thickness dimension of the stage 2*a*. For example, as illustrated in FIG. 1, when the holder 2*a*1 comes into contact with the stage 2*a*, a predetermined gap is formed between the stage 2*a* and the base 9*a*1. With this configuration, it is possible to move the positions of the plurality of holders 2*a*1 in the lifting direction, and furthermore, the position of the substrate 100 held by the plurality of holders 2*a*1.

The lift 9*b* moves the position of the support 9*a* in the lifting direction, and furthermore, the position of the substrate 100 held by the plurality of holders 2*a*1.

The lift 9*b* may include a base 9*b*1 (corresponding to an example of a second base) and a driving unit 9*b*2.

The base 9*b*1 may be provided inside the housing 6. The base 9*b*1 has, for example, an annular shape, and faces the base 9*a*1 via a predetermined gap. The base 9*b*1 may be provided substantially in parallel to the base 9*a*1. For example, in the central region of the base 9*b*1, a hole is formed penetrating the base 9*b*1 in the thickness direction, and the rotary shaft 2*b* is provided in the hole with a predetermined gap. While the annular base 9*b*1 is described, the shape of the base 9*b*1 is not limited thereto. For example, the hole that penetrates the base 9*b*1 in the thickness direction may be opened at the side surface of the base 9*b*1. For example, the planar shape of the base 9*b*1 may be a C- or U-shape. The base 9*b*1 may be provided outside the rotary shaft 2*b* through a predetermined gap. In this case, the planar shape and the planar dimension of the base 9*b*1 may be the same as or different from the planar shape and the planar dimension of the base 9*a*1.

The lift 9*b* is connected to the support 9*a* by a repulsive force, to move the support 9*a* up and down. Thus, the base 9*b*1 faces the base 9*a*1, and has the magnetism with the same polarity as that of the base 9*a*1. For example, at least the portion of the base 9*b*1 that faces the base 9*a*1 has the magnetism. In this case, a permanent magnet may be provided on the portion of the base 9*b*1 that faces the base 9*a*1, or the base 9*b*1 may be magnetized. Further, the polarity of the portion of the base 9*b*1 that has the magnetism may be the same as the polarity of the portion of the base 9*a*1 that has the magnetism. Thus, the repulsive force is generated between the base 9*b*1 and the base 9*a*1.

The driving unit 9*b*2 may be provided outside the housing 6. The driving unit 9*b*2 moves the position of the base 9*b*1 in the lifting direction. The driving unit 9*b*2 is not particularly limited, and may be any driving unit that is able to move the base 9*b*1 up and down. The driving unit 9*b*2 may be provided with, for example, a device such as an air cylinder or a servomotor, and a guide mechanism.

Figure 2:
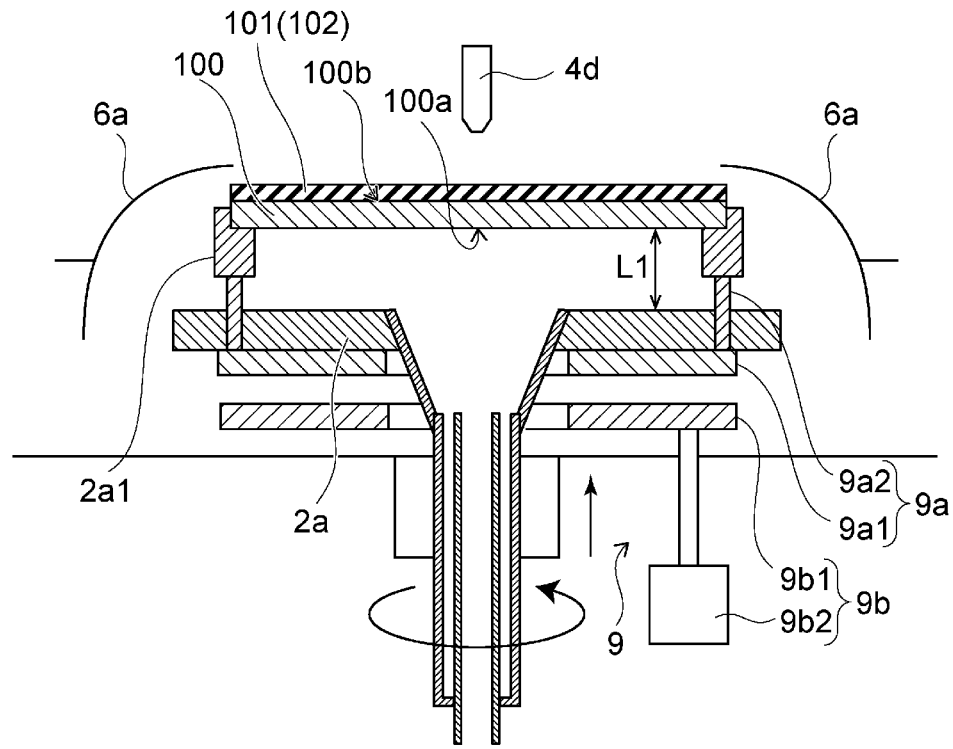
FIG. 2 is a schematic view illustrating a state where a base is moved up.

FIG. 2 is a schematic view illustrating a state where the base 9*a*1 is moved up.

Figure 3:
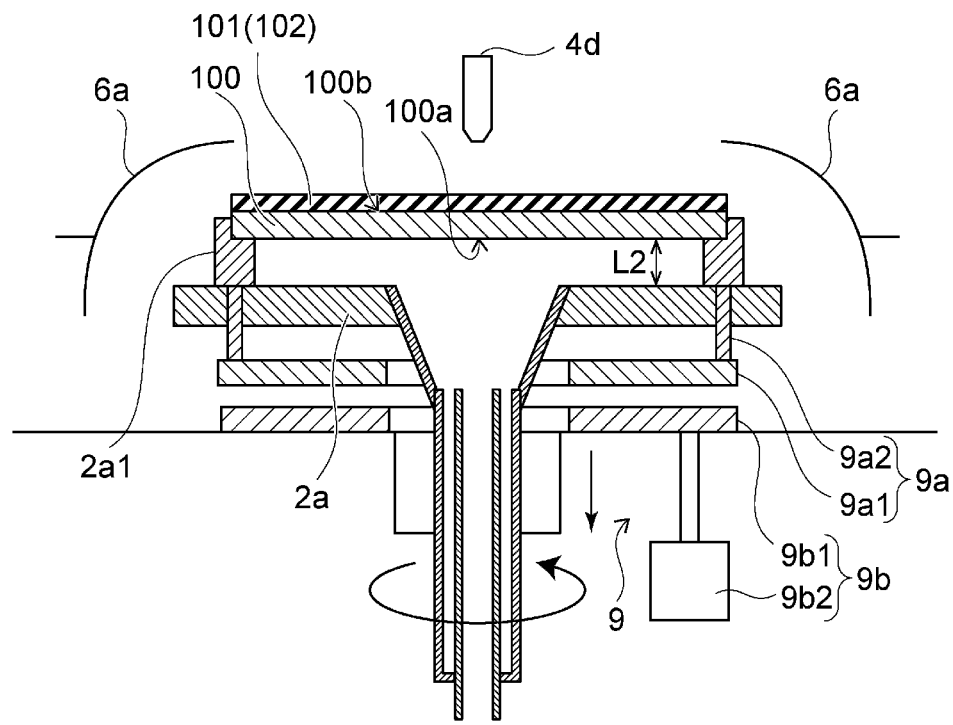
FIG. 3 is a schematic view illustrating a state where the base is moved down.

FIG. 3 is a schematic view illustrating a state where the base 9*a*1 is moved down.

Since the repulsive force is being generated between the base 9*b*1 and the base 9*a*1 as described above, the base 9*a*1 moves up by repelling from the base 9*b*1 when the base 9*b*1 moves up, as illustrated in FIG. 2. When the base 9*a*1 moves up, the substrate 100 held by the plurality of holders 2*a*1 moves up, so that the distance L1 between the substrate 100 and the stage 2*a* increases. In this case, when the base 9*a*1 and the stage 2*a* are brought into contact with each other as illustrated in FIG. 2, the distance L1 between the substrate 100 and the stage 2*a* may be kept constant. Further, the stage 2*a* is connected to the driving unit 2*c* via the rotary shaft 2*b*. The driving unit 2*c* is fixed to the housing 6 as described above. Accordingly, the stage 2*a* is rotatably fixed to the housing 6. That is, even when the base 9*a*1 comes into contact with the stage 2*a*, the position of the stage 2*a* does not change. Further, the stage 2*a* and the base 9*a*1 are brought into contact with each other, so as to suppress the substrate 100 from falling from the plurality of holders 2*a*1.

Meanwhile, as illustrated in FIG. 3, when the base 9*b*1 moves down, the base 9*a*1 moves down due to its own weight. When the base 9*a*1 moves down, the substrate 100 held by the plurality of holders 2*a*1 moves down, and the distance L2 between the substrate 100 and the stage 2*a* decreases. In this case, as illustrated in FIG. 3, when the plurality of holders 2*a*1 and the stage 2*a* are brought into contact with each other, the distance L2 between the substrate 100 and the stage 2*a* may be kept constant. As described above, the stage 2*a* is rotatably fixed to the housing 6. Thus, even when the plurality of holders 2*a*1 come into contact with the stage 2*a*, the position of the stage 2*a* does not change. Further, the stage 2*a* and the plurality of holders 2*a*1 are brought into contact with each other, so as to suppress the substrate 100 from falling from the plurality of holders 2*a*1.

Further, since the distance between the base 9*b*1 and the base 9*a*1 is kept substantially constant by the repulsive force, the distance between the substrate 100 and the stage 2*a* may be adjusted according to the position of the base 9*b*1.

The controller 10 controls the operation of each component provided in the substrate processing apparatus 1. The controller 10 may include, for example, an arithmetic device such as a central processing unit (CPU) and a storage device such as a semiconductor memory. The controller 10 may be, for example, a computer. The storage device may store a control program for controlling the operation of each component provided in the substrate processing apparatus 1. The arithmetic device controls the operation of each component provided in the substrate processing apparatus 1 by using, for example, the control program stored in the storage device and data input by an operator.

For example, the cooling rate of the liquid 101 correlates with the thickness of a liquid film. For example, as the liquid film is thinner, the cooling rate of the liquid 101 is faster. Conversely, as the liquid film is thicker, the cooling rate of the liquid 101 is slower. Accordingly, based on the thickness of the liquid 101 (the thickness of the liquid film), the controller 10 may control the cooling unit 3 to control the flow rate of the cooling gas 3*a*1, and furthermore, the cooling rate of the liquid 101. In this case, the controller 10 may control the placing unit 2, the cooling unit 3, and the first liquid supply unit 4, to control the rotation of the substrate 100, the flow rate of the cooling gas 3a1, and the supply amount of the liquid 101.

Further, the controller 10 may control the placing unit 2 and the cooling unit 3, to bring the liquid 101 on the front surface 100b of the substrate 100 into the supercooled state, to freeze the liquid 101 in the supercooled state thereby forming a frozen film, and to lower the temperature of the frozen film thereby causing cracks in the frozen film. Details of the formation of the frozen film or the cracks will be described later.

For example, the controller 10 may control the cooling unit 3 to perform a switching between a first step of supplying the cooling gas 3a1 and a second step of stopping the supply of the cooling gas 3a1.

In the first step, the controller 10 may control the moving unit 9 to set the distance between the stage 2a and the substrate 100 held by the plurality of holders 2a1 to a first distance. In the second step, the controller 10 may control the moving unit 9 to set the distance to a second distance longer than the first distance. The first distance is, for example, the distance L2 illustrated in FIG. 3. The second distance is, for example, the distance L1 illustrated in FIG. 2.

For example, in a preliminary step, a liquid film forming step, and a cooling step which will be described later, the substrate 100 held by the plurality of holders 2a1 is moved down, to decrease the distance between the substrate 100 and the stage 2a.

For example, in the thawing step and the drying step which will be described later, the substrate 100 held by the plurality of holders 2a1 is moved up, to increase the distance between the substrate 100 and the stage 2a, so that the amount of heat transferred from the substrate 100 to the stage 2a due to the radiation is reduced. Further, the substrate is suppressed from being cooled by the air cooled by the stage.

Details of the lifting position of the substrate 100 in each step and the effects thereof will be described later.

Next, descriptions will be made on the operation of the substrate processing apparatus 1 and the substrate processing method according to the present embodiment.

Figure 4:
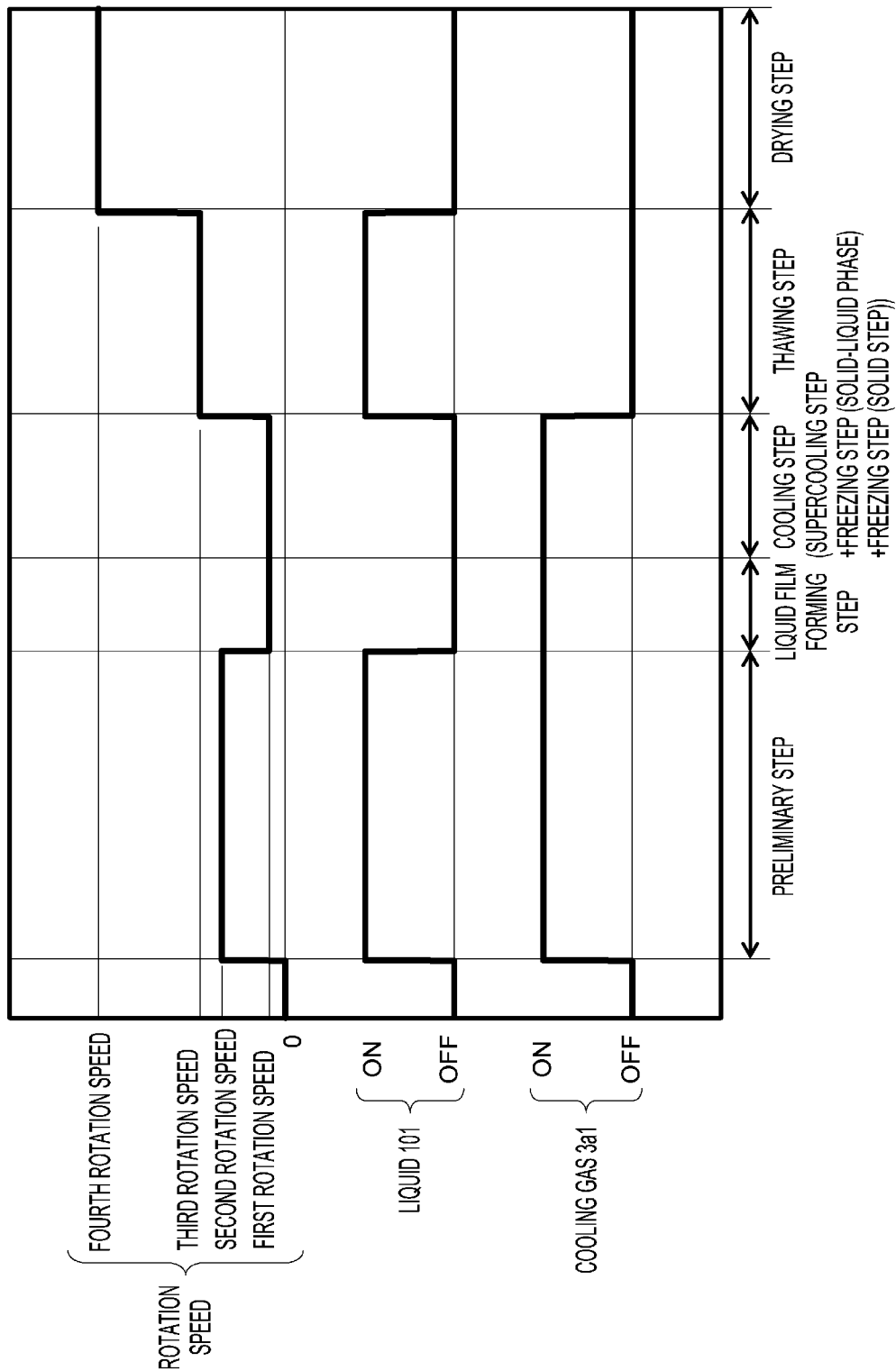
FIG. 4 is a timing chart illustrating an operation of the substrate processing apparatus.

FIG. 4 is a timing chart illustrating the operation of the substrate processing apparatus 1.

Figure 5:
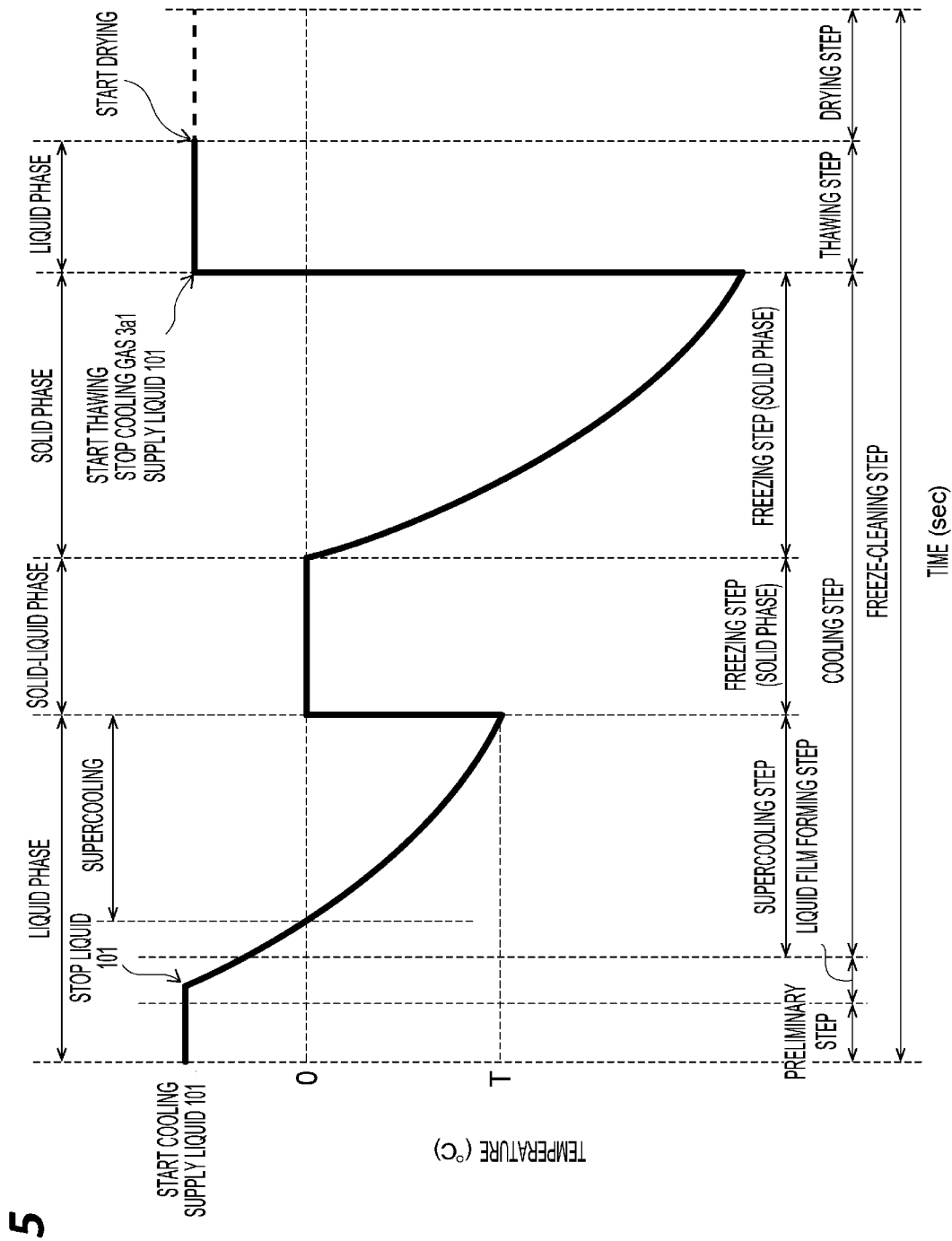
FIG. 5 is a graph illustrating a temperature variation in a freeze-cleaning step.

FIG. 5 is a graph illustrating a temperature variation in the freeze-cleaning step.

FIGS. 4 and 5 represent a case where the substrate 100 is a 6,025 quartz (Qz) substrate (152 mm×152 mm×6.35 mm), and the liquid 101 is pure water.

First, the substrate 100 is carried into the housing 6 by a transfer device (not illustrated) through a carry-in/out port (not illustrated) of the housing 6. The carried-in substrate 100 is placed and held on the plurality of holders 2a1 of the stage 2a.

In this case, the controller 10 controls the driving unit 9b2 so that the base 9b1 is being moved up. Accordingly, the plurality of holders 2a1 also are being moved up. Thus, the distance between the substrate 100 and the stage 2a becomes, for example, the distance L1 (the second distance) illustrated in FIG. 2.

The transfer device (not illustrated) moves from the inside of the housing 6 to the outside of the housing 6 before the preliminary step to be described later is performed. The distance L1 between the substrate 100 and the stage 2a is maintained until the movement of the transfer device (not illustrated) to the outside of the housing 6 is completed. Since the distance L1 is maintained, the amount of heat transferred from the substrate 100 to the stage 2a due to the radiation may be reduced. Further, the substrate is suppressed from being cooled by the air cooled by the stage.

After the substrate 100 is placed and held on the stage 2a, the freeze-cleaning step that includes the preliminary step, the liquid film forming step, the cooling step, the thawing step, and the drying step is performed as illustrated in FIG. 4.

First, the preliminary step is performed as illustrated in FIGS. 4 and 5. In the preliminary step, the controller 10 controls the driving unit 9b2 to move the base 9b1 down. When the base 9b1 moves down, the base 9a1 moves down, and the substrate 100 held by the plurality of holders 2a1 moves down. Thus, the distance between the substrate 100 and the stage 2a decreases. This distance is the distance L2 illustrated in FIG. 3 (the first distance). Then, the volume of the space to which the cooling gas 3a1 is supplied, between the substrate 100 and the stage 2a, may be reduced so that the cooling efficiency may be improved, or the consumption of the cooling gas 3a1 may be reduced. For example, the distance between the substrate 100 and the stage 2a may be about 1 mm to about 5 mm.

Further, the controller 10 controls the supply unit 4b and the flow rate control unit 4c, to supply the liquid 101 to the front surface 100b of the substrate 100 at a predetermined flow rate. Further, the controller 10 controls the flow rate control unit 3c, to supply the cooling gas 3a1 to the back surface 100a of the substrate 100 at a predetermined flow rate. Further, the controller 10 controls the driving unit 2c, to rotate the substrate 100 at a second rotation speed.

Here, when the atmosphere inside the housing 6 is cooled due to the supply of the cooling gas 3a1 by the cooling unit 3, frost containing dust in the atmosphere may adhere to the substrate 100, which may cause a contamination. In the preliminary step, since the liquid 101 is being continuously supplied to the front surface 100b of the substrate 100, the adhesion of frost to the front surface 100b of the substrate 100 may be suppressed, while uniformly cooling the substrate 100. Further, before the substrate 100 is cooled, the space between the substrate 100 and the stage 2a is filled with the cooling gas 3a1. The cooling gas 3a1 may be a dry gas. Thus, the adhesion of frost to the back surface 100a of the substrate is also suppressed.

As long as the adhesion of frost to the front surface 100b of the substrate 100 may be suppressed, the supply of the liquid 101 and the supply of the cooling gas 3a1 may be started simultaneously with the downward-movement of the base 9b1, or before or after the downward-movement of the base 9b1. Further, the supply of the liquid 101 and the supply of the cooling gas 3a1 may be started at different timings.

For example, in the case illustrated in FIG. 4, the second rotation speed may be set to about 20 rpm to about 500 rpm, the flow rate of the liquid 101 may be set to about 0.1 L/min to about 1.0 L/min, the flow rate of the cooling gas 3a1 may be set to about 40 NL/min to about 200 NL/min, and the process time of the preliminary step may be set to about 1,800 seconds. The process time of the preliminary step may be any time during which the in-plane temperature of the substrate 100 becomes substantially uniform, and is appropriately determined by conducting an experiment or a simulation.

The temperature of the liquid film in the preliminary step becomes substantially the same as the temperature of the supplied liquid 101, since the liquid 101 is in a trickle flow state. For example, when the temperature of the supplied liquid 101 is about room temperature (20° C.), the temperature of the liquid film becomes about room temperature (20° C.).

Next, the liquid film forming step is performed as illustrated in FIGS. 4 and 5. In the liquid film forming step, the rotation speed of the substrate 100 is set to a rotation speed (a first rotation speed) at which the liquid film is formed with the thickness that ensures a relatively high removal rate (a predetermined thickness). For example, the first rotation speed is 0 rpm to 100 rpm. That is, the controller 10 rotates the substrate 100 at a rotation speed lower than the rotation speed during the preliminary process. Then, as illustrated in FIG. 4, the supply of the liquid 101 supplied in the preliminary step is stopped. The first rotation speed may be a rotation speed that may suppress the thickness of the liquid film from becoming uneven due to the centrifugal force. During the liquid film forming step, the flow rate of the cooling gas 3a1 is maintained at the same supply amount as that in the preliminary step. As a result, the in-plane temperature of the substrate 100 may be maintained in the substantially uniform state during the preliminary step.

Further, the rotation speed in the preliminary step may be set to the first rotation speed. In this case, the rotation speed in the liquid film forming step may be maintained to be the same as the rotation speed in the preliminary step. Further, the second rotation speed may be a rotation speed equal to or less than the first rotation speed.

Further, when the preliminary step switches to the liquid film forming step, the supply of the liquid 101 may be stopped, and then, the liquid 101 supplied in the preliminary step may be discharged by rotating the substrate 100 at a high speed. In this case, once the liquid 101 is discharged, a predetermined amount of the liquid 101 may be supplied to the substrate 100, after setting the rotation speed of the substrate 100 to a rotation speed (50 rpm) or less that substantially maintains the liquid film with the uniform thickness, or stopping the rotation of the substrate 100. In this way, the liquid film having the predetermined thickness may be easily formed.

As described later, the thickness of the liquid film when the cooling step is performed may be about 30 μm to about 1,300 μm. For example, the controller 10 controls the supply amount of the liquid 101 and the rotation speed of the substrate 100, to set the thickness of the liquid film on the front surface 100b of the substrate 100 to about 30 μm to about 1,300 μm.

Next, the cooling step is performed as illustrated in FIGS. 4 and 5. In the cooling step of the present embodiment, the time period until the start of the freezing of the liquid 101 brought into the supercooled state will be referred to as a "supercooling step," the time period from the start of the freezing of the liquid 101 in the supercooled state to the completion of the freezing will be referred to as a "freezing step (solid-liquid phase)," and the time period until the frozen liquid 101 is further cooled to cause cracks will be referred to as a "freezing step (solid phase)." In the supercooling step, only the liquid 101 exists on the front surface 100b of the substrate 100. In the freezing step (solid-liquid phase), the liquid 101 and the frozen liquid 101 exist on the front surface 100b of the substrate 100. In the freezing step (solid phase), only the frozen liquid 101 exists on the front surface 100b of the substrate 100.

The solid-liquid phase refers to a state where the liquid 101 and the frozen liquid 101 coexist.

First, in the supercooling step, the temperature of the liquid film on the substrate 100 is further lowered as compared to the temperature of the liquid film in the liquid film forming step, by the cooling gas 3a1 that is being continuously supplied to the back surface 100a of the substrate 100, so that the liquid 101 enters the supercooled state.

Here, when the cooling rate of the liquid 101 becomes excessively fast, the liquid 101 is immediately frozen without entering the supercooled state. Thus, the controller 10 controls at least one of the rotation speed of the substrate 100, the flow rate of the cooling gas 3a1, and the supply amount of the liquid 101, to bring the liquid 101 on the front surface 100b of the substrate 100 into the supercooled state.

The control conditions for bringing the liquid 101 into the supercooled state are affected by, for example, the size of the substrate 100, the viscosity of the liquid 101, and the specific heat of the cooling gas 3a1. Thus, the control conditions for bringing the liquid 101 into the supercooled state may be appropriately determined by conducting an experiment or a simulation.

In the supercooled state, the freezing of the liquid 101 starts by, for example, the temperature of the liquid film, the existence of contaminants such as particles, and the vibration. For example, in a case where contaminants such as particles exist, the freezing of the liquid 101 starts when a temperature T of the liquid 101 reaches −35° C. or higher and −20° C. or lower.

When the freezing of the liquid 101 in the supercooled state starts, the supercooling step switches to the freezing step (solid-liquid phase). In the freezing step (solid-liquid phase), the liquid 101 and the frozen liquid 101 exist on the front surface 100b of the substrate 100. As described above, it is considered that since the contaminants may trigger the start of the freezing of the liquid 101 in the supercooled state, the contaminants are incorporated into the solid. Further, it is considered that the contaminants adhering to the front surface 100b of the substrate 100 are separated by the pressure wave generated from the volume change or the physical force generated from the volume increase, when the liquid 101 changes into the solid. Thus, it is considered that the cleaning is performed in the manner that the contaminants are incorporated into the solid, or the contaminants adhering to the front surface 100b of the substrate 100 are separated by the pressure wave or the physical force generated when a part of the liquid 101 is frozen.

When the liquid film on the front surface 100b of the substrate 100 is completely frozen, the freezing step (solid-liquid phase) switches to the freezing step (solid phase). In the freezing step (solid phase), the temperature of the frozen film on the front surface 100b of the substrate 100 is further lowered. Here, the liquid 101 mainly contains water. Thus, when the liquid film on the front surface 100b of the substrate 100 is completely frozen so that a frozen film is formed and the temperature of the frozen film is further lowered, the volume of the frozen film is reduced, and the stress is generated in the frozen film.

In this case, for example, when the temperature of the frozen film becomes −50° C. or lower, cracks are generated in the frozen film. When cracks are generated in the frozen film, the contaminants that adhere to the front surface 100b of the substrate 100 are more easily separated from the front surface 100b of the substrate 100.

Next, after the cracks are generated in the frozen film, the thawing step is performed as illustrated in FIGS. 4 and 5. The occurrence of cracking may be detected by, for example, a sensor (not illustrated). FIGS. 4 and 5 illustrate a case where the liquid 101 and the liquid 102 are the same. Therefore, the liquid is described as liquid 101 in FIGS. 4 and 5.

In the thawing step, the controller 10 controls the supply unit 4b and the flow rate control unit 4c, to supply the liquid 101 to the front surface 100b of the substrate 100 at a predetermined flow rate. When the liquid 101 and the liquid 102 are different from each other, the controller 10 controls the supply unit 5b and the flow rate control unit 5c, to supply the liquid 102 to the front surface 100b of the substrate 100 at a predetermined flow rate.

Further, the controller 10 controls the flow rate control unit 3c, to stop the supply of the cooling gas 3a1. Further, the controller 10 controls the driving unit 2c, to set the rotation speed of the substrate 100 to a third rotation speed. The third rotation speed is, for example, 200 rpm to 700 rpm. When the rotation of the substrate 100 becomes faster, the liquid 101 may be scattered outwards by the centrifugal force. As a result, the liquid 101 may be discharged from the front surface 100b of the substrate 100. At this time, the contaminants separated from the front surface 100b of the substrate 100 are also discharged together with the liquid 101.

The supply amount of the liquid 101 or the liquid 102 is not particularly limited as long as the thawing may be implemented. Further, the rotation speed of the substrate 100 is not particularly limited as long as the liquid 101 and the contaminants may be discharged.

Here, as described above, the supply of the cooling gas 3a1 is stopped during the thawing step. Thus, the substrate 100 is not cooled directly by the cooling gas 3a1. However, in the preliminary step, the liquid film forming step, and the cooling step, the cooling gas 3a1 is continuously supplied, and thus, the stage 2a is cooled. In this case, even though the supply of the cooling gas 3a1 is stopped during the thawing step, the temperature of the stage 2a remains low for a certain time period. When the temperature of the stage 2a is relatively low, the amount of heat transferred from the substrate 100 to the stage 2a due to the radiation increases, and thus, the substrate 100 may be cooled. Further, the air around the stage may be cooled by the stage, and the substrate may be cooled by the cooled air. When the substrate 100 is cooled, a dew condensation containing particles in the atmosphere may occur on the front surface 100b or the back surface 100a of the substrate 100. When the dew condensation occurs, for example, a contamination or watermarks may occur.

Thus, in the substrate processing apparatus 1 according to the present embodiment, the controller 10 controls the driving unit 9b2 to move the base 9b1 up. As described above, since the repulsive force is being generated between the base 9b1 and the base 9a1, the base 9a1 moves up by repelling from the base 9b1 when the base 9b1 moves up. When the base 9a1 moves up, the substrate 100 held by the plurality of holders 2a1 moves up, so that the distance between the substrate 100 and the stage 2a increases. In this case, the distance is the distance L1 that corresponds to the second distance. When the distance between the substrate 100 and the stage 2a increases, the amount of heat transferred from the substrate 100 to the stage 2a due to the radiation decreases, even when the temperature of the stage 2a is relatively low. Further, the substrate is suppressed from being cooled by the air cooled by the stage. Thus, it is possible to suppress the occurrence of dew condensation on the front surface 100b or the back surface 100a of the substrate 100 due to the cooling of the substrate 100. Further, since the amount of heat transferred from the substrate 100 to the stage 2a decreases, the thawing time is reduced. The distance between the substrate 100 and the stage 2a is, for example, 10 mm or more.

The base 9b1 and the base 9a1 are connected to each other by the repulsive force. Thus, even when the base 9a1 rotates together with the stage 2a, and the position of the base 9b1 in the rotation direction of the stage 2a is fixed, the position of the base 9a1, and furthermore, the position of the substrate 100 may be maintained.

The timing when the controller 10 controls the driving unit 9b2 to move the base 9b1 up may be a timing before or after the liquid 101 is supplied to the front surface 100b of the substrate 100. In the cooling step, the holders 2a1 cooled by the stage 2a may be frozen and adhere to the stage 2a. By providing the above-described liquid-repellent film on the surface of the stage 2a and the surfaces of the holders 2a1 in contact with the stage 2a, the holders 2a1 and the stage 2a may be easily separated from each other when the base 9b1 is moved up, even though the holders 2a1 and the stage 2a are frozen and adhere to each other.

Further, by moving the base 9b1 up after the liquid 101 is supplied to the front surface 100b of the substrate 100, the holders 2a1 may be thawed by the liquid 101 and may be more smoothly moved up, even though the holders 2a1 are frozen and adhere to the stage 2a.

The timing when the controller 10 controls the driving unit 9b2 to move the base 9b1 up may be a timing before or after the rotation speed is set to the third rotation speed.

Next, the drying step is performed as illustrated in FIGS. 4 and 5.

In the drying step, the controller 10 controls the supply 4b and the flow rate controller 4c, to stop the supply of the liquid 101. When the liquid 101 and the liquid 102 are different from each other, the controller 10 controls the supply 5b and the flow rate controller 5c to stop the supply of the liquid 102.

Further, in the drying step, the controller 10 controls the driving unit 2c to increase the rotation speed of the substrate 100 to a fourth rotation speed faster than the third rotation speed. When the rotation of the substrate 100 becomes faster, the drying of the substrate 100 may be quickly performed. The rotation speed of the substrate 100 is not particularly limited as long as the drying may be implemented.

Further, in the drying step, the controller 10 may control the driving unit 9b2 to maintain, for example, the position of the base 9b1. That is, the distance between the substrate 100 and the stage 2a in the thawing step may be maintained. Further, the controller 10 may control the driving unit 9b2 to set the distance between the substrate 100 and the stage 2a to be longer or shorter than the distance in the thawing step. For example, the distance is set to a third distance which is longer than the first distance and different from the second distance. The third distance is, for example, 6 mm to 9 mm. Further, the third distance may be longer than the second distance.

When the first distance, the second distance, and the third distance are controlled, the driving unit 9b2 may be an air cylinder that includes two cylinders, a combination of two air cylinders, or a combination of an air cylinder and a servomotor.

For example, when the temperature of the stage 2a in the drying step does not significantly change from the temperature of the stage 2a in the thawing step, the distance between the substrate 100 and the stage 2a may be maintained. When the temperature of the stage 2a in the drying step is higher than the temperature of the stage 2a in the thawing step, the distance between the substrate 100 and the stage 2a may be reduced. The dried substrate 100 is carried out by a transfer device (not illustrated). Thus, in order to facilitate the transfer to the transfer device, the distance between the substrate 100 and the stage 2*a* may be set to a fourth distance longer than the second distance.

When the first distance, the second distance, and the fourth distance are controlled, the driving unit 9*b*2 may be an air cylinder that includes two cylinders, a combination of two air cylinders, or a combination of an air cylinder and a servomotor.

When the first distance, the second distance, the third distance, and the fourth distance are controlled, the driving unit 9*b*2 may be a multi-stage air cylinder, a combination of a plurality of air cylinders, or a combination of a plurality of air cylinders and servomotors.

When the freeze-cleaning is completed, the substrate 100 is carried to the outside of the housing 6 by a transfer device (not illustrated) through a carry-in/out port (not illustrated) of the housing 6.

In this way, one freeze-cleaning step may be performed. The freeze-cleaning step may be performed multiple times.

As described above, the substrate processing method according to the present embodiment includes the cooling step for, while the substrate 100 with a liquid film formed on one surface (the front surface 100*b*) thereof is being rotated, supplying the cooling gas 3*a*1 to the other surface (the back surface 100*a*) of the substrate 100, and the thawing step for thawing the liquid frozen in the cooling step. In the cooling step, the distance between the substrate 100 and the stage 2*a* on which the substrate 100 is placed is set to the first distance. In the thawing step, the supply of the cooling gas 3*a*1 is stopped, and the distance is set to the second distance longer than the first distance.

The substrate processing method according to the present embodiment may further include the drying step for drying the substrate 100 on which the liquid has been thawed. In the drying step, the supply of the cooling gas 3*a*1 is stopped, and the distance may be set to the second distance, or the third distance longer than the first distance and different from the second distance.

The substrate processing method according to the present embodiment may further include the carrying-out step for carrying the dried substrate 100 out. In the carrying-out step, the supply of the cooling gas 3*a*1 is stopped, and the distance may be set to the second distance, or the fourth distance longer than the second distance.

Figure 6:
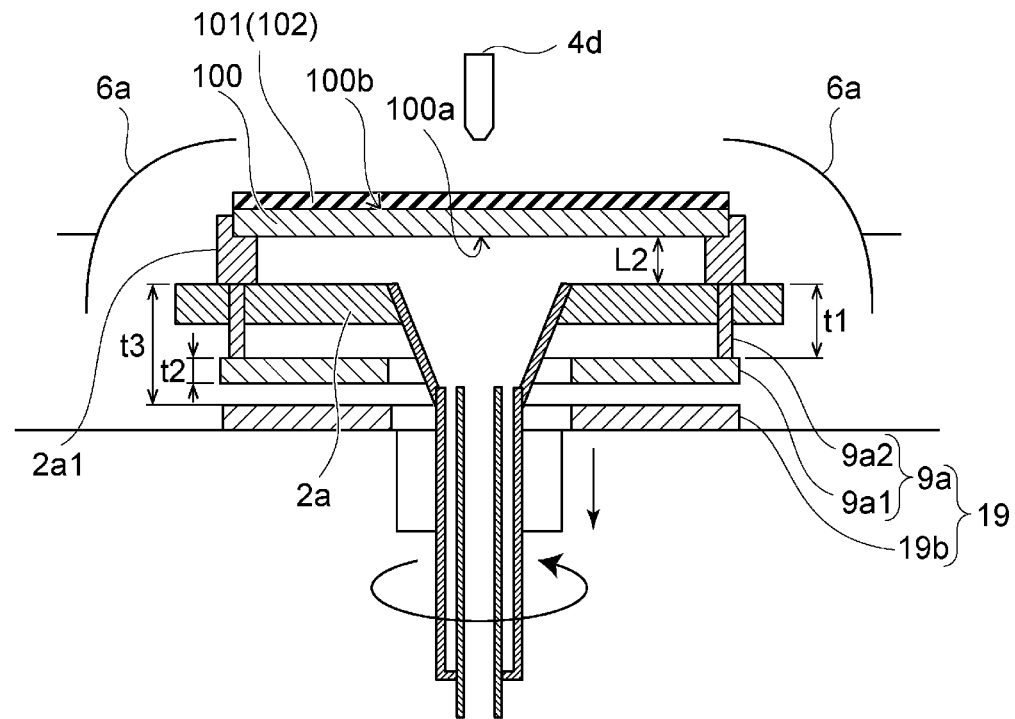
FIG. 6 is a schematic view illustrating a moving unit according to another embodiment.

FIG. 6 is a schematic view illustrating a moving unit 19 according to another embodiment.

The moving unit 19 moves the positions of the plurality of holders 2*a*1 with respect to the stage 2*a*, and furthermore, the position of the substrate 100 with respect to the stage 2*a*.

As illustrated in FIG. 6, the moving unit 19 may include the support 9*a* and a lift 19*b*.

The lift 19*b* may be, for example, an electromagnet. For example, by providing an electromagnet on the bottom surface of the housing 6, and supplying current to the electromagnet so as to generate the repulsive force described above, the base 9*a*1 may be moved up. When the supply of current to the electromagnet is stopped, the base 9*a*1 may be moved down by its own weight.

The base 9*a*1 does not come into contact with the lift 19*b*. In order to prevent the base 9*a*1 from coming into contact with the lift 19*b*, the equation "t3>t1+t2" may be satisfied.

In this case, t3 is the distance from the upper surface of the lift 19*b* to the upper surface of the stage 2*a*, t1 is the length of the column 9*a*2, and t2 is the thickness of the base 9*a*1.

Since the polarity of the electromagnet is determined by the flowing direction of the current and the winding direction of a coil, the flowing direction of the current may be switched to generate an attractive force, and the base 9*a*1 may be moved down by the attractive force and its own weight. Further, the driving unit 9*b*2 described above may be further provided to move the electromagnet up and down.

Figure 7:
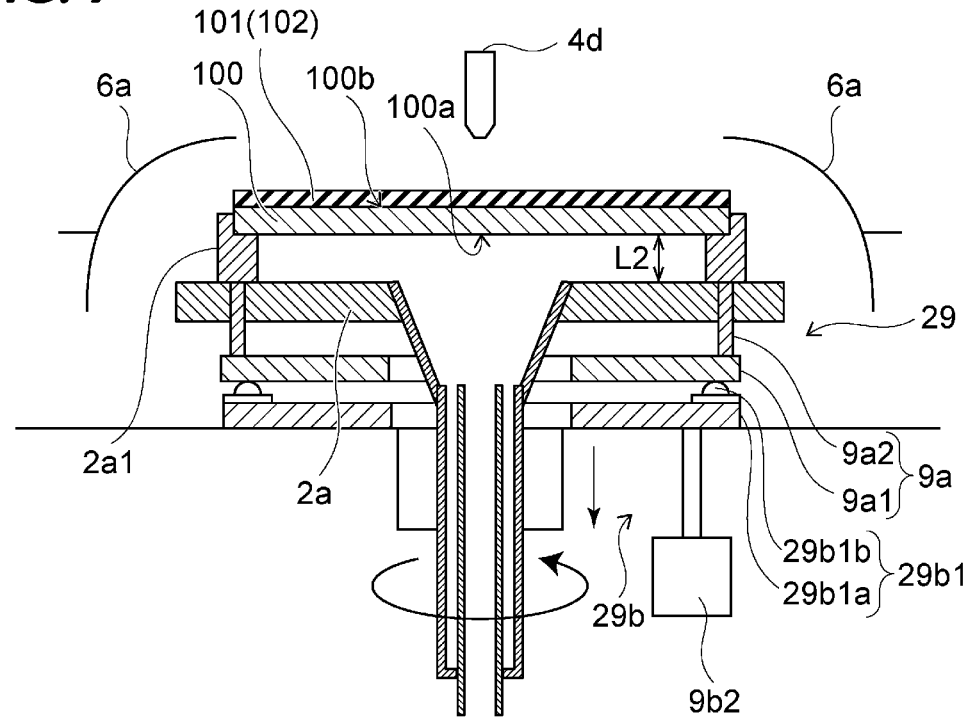
FIG. 7 is a schematic view illustrating a moving unit according to yet another embodiment.

FIG. 7 is a schematic view illustrating a moving unit 29 according to yet another embodiment.

The moving unit 29 moves the positions of the plurality of holders 2*a*1 with respect to the stage 2*a*, and furthermore, the position of the substrate 100 with respect to the stage 2*a*.

As illustrated in FIG. 7, the moving unit 29 may include the support 9*a* and a lift 29*b*.

The lift 29*b* may include, for example, a base 29*b*1 and a driving unit 9*b*2.

The base 29*b*1 may include, for example, a base 29*b*1*a* and a support member 29*b*1*b*.

The base 29*b*1*a* has a plate shape, and may be provided inside the housing 6. The planar shape and the planar dimension of the base 29*b*1*a* may be the same as, for example, the planar shape and the planar dimension of the base 9*b*1 described above.

A plurality of support members 29*b*1*b* may be provided on the surface of the base 29*b*1*a* that faces the base 9*a*1. The plurality of support members 29*b*1*b* may be brought into contact with the base 9*a*1. Each support member 29*b*1*b* may include a rotatable ball, such that the ball may be brought into contact with the base 9*a*1. The support members 29*b*1*b* may be, for example, a free ball bearing, ball casters, or ball rollers.

In the moving unit 29 according to the present embodiment, when the base 29*b*1*a* moves up, the base 9*a*1 is pushed by the base 29*b*1*a* via the plurality of support members 29*b*1*b*. Accordingly, the substrate 100 held by the plurality of holders 2*a*1 moves up, so that the distance between the substrate 100 and the stage 2*a* increases. When the base 29*b*1*a* moves down, the base 9*a*1 moves down by its own weight. When the base 9*a*1 moves down, the substrate 100 held by the plurality of holders 2*a*1 moves down, so that the distance between the substrate 100 and the stage 2*a* decreases.

The portion of the support member 29*b*1*b* in contact with the base 9*a*1 is the rotatable ball. Thus, even when the base 9*a*1 rotates together with the stage 2*a*, and the position of the base 29*b*1*a* in the rotation direction of the stage 2*a* is fixed, the position of the base 9*a*1, and furthermore, the position of the substrate 100 may be maintained.

When the plurality of support members 29*b*1*b* are brought into contact with the base 9*a*1, the upward-movement operation of the base 9*a*1 may be stabilized. However, considering the generation of particles or vibration, it may be desirable to connect the base 9*b*1 and the base 9*a*1 to each other by the repulsive force.

Figure 8:
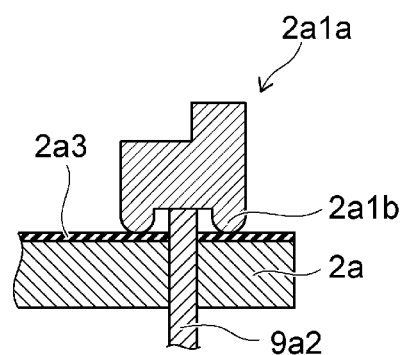
FIG. 8 is a schematic view illustrating a holder according to yet another embodiment.

FIG. 8 is a schematic view illustrating a holder 2*a*1*a* according to yet another embodiment.

As illustrated in FIG. 8, the holder 2*a*1*a* may be provided, instead of the holder 2*a*1 described above. For example, the holder 2*a*1*a* may be formed by adding at least one convex portion 2*a*1*b* (corresponding to an example of a second (e.g., convex-shape) liquid repellent) to the surface of the holder 2*a*1 that faces the stage 2*a*. The convex portion 2*a*1*b* has the property of more easily repelling the liquid 101 (liquid repellency) than the stage 2*a*. The convex portion 2*a*1*b* is formed of, for example, a material having the liquid repellency described above.

When the convex portion 2*a*1*b* is provided, the contact area between the holder 2*a*1*a* and the stage 2*a* may be reduced. Thus, even when the holder 2*a*1*a* and the stage 2*a* are frozen and adhere to each other, the holder 2a1a and the stage 2a are easily separated from each other when the base 9b1 is moved up.

Further, as illustrated in FIG. 8, a liquid repellent 2a3 (corresponding to an example of the first (e.g., film-shape) liquid repellent) may be further provided on the surface of the stage 2a. The liquid repellent 2a3 has a film shape, and is formed of a material having the liquid repellency described above. When the liquid repellent 2a3 is provided on the surface of the stage 2a, the holder 2a1a and the stage 2a are more easily separated from each other when the base 9b1 is moved up.

Figure 9:
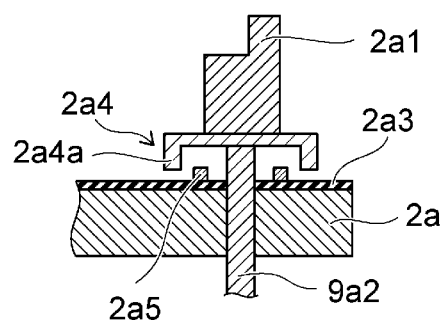
FIG. 9 is a schematic view illustrating a liquid repellent according to yet another embodiment.

FIG. 9 is a schematic view illustrating a liquid repellent 2a4 (corresponding to an example of a third (e.g., plate-shape) liquid repellent) and a liquid repellent 2a5 (corresponding to an example of a fourth liquid repellent) according to yet another embodiment.

As illustrated in FIG. 9, the liquid repellent 2a3 (corresponding to an example of the first (e.g., film-shape) liquid repellent) may be provided on the surface of the stage 2a. Further, the liquid repellent 2a4 may be provided on the surface of the holder 2a1 that faces the stage 2a. The liquid repellent 2a4 has a plate shape, and includes a convex portion 2a4a on the surface thereof that faces the stage 2a. The convex portion 2a4a may be provided near the peripheral edge of the liquid repellent 2a4. The convex portion 2a4a may have an annular shape. The liquid repellent 2a4 has the property of more easily repelling the liquid 101 (liquid repellency) than the stage 2a. The liquid repellent 2a4 is formed of, for example, a material having the liquid repellency described above.

Further, as illustrated in FIG. 9, the liquid repellent 2a5 in a convex shape may be provided on the surface of the stage 2a. The liquid repellent 2a5 may be provided, for example, at the position that faces the liquid repellent 2a4. At least one of the liquid repellent 2a4 and the liquid repellent 2a5 may be provided. The liquid repellent 2a5 may have an annular shape. The liquid repellent 2a5 has the property of more easily repelling the liquid 101 (liquid repellency) than the stage 2a. The liquid repellent 2a5 is formed of, for example, a material having the liquid repellency described above.

When the liquid repellent 2a4 and the liquid repellent 2a5 are provided, a gap is provided between the portion of the liquid repellent 2a4 where the convex portion 2a4a does not exist, and the liquid repellent 2a5, in the preliminary step, the liquid film forming step, and the cooling step. The gap has a height equal to or more than the height of the contact angle between the liquid 101 and the surface of the stage 2a (e.g., 5 mm or more). For example, by moving up the liquid repellent 2a4 with the lift 9b, a gap of 5 mm or more is provided between the portion of the liquid repellent 2a4 where the convex portion 2a4a does not exist, and the liquid repellent 2a5. Further, since the liquid repellent 2a4 and the convex portion 2a4a are liquid repelling surfaces, the contact angle is 90° or more. Thus, when the amount of an attached liquid is small, the liquid becomes substantially a spherical shape. When the amount of the attached liquid is large, the liquid becomes an oval shape (film shape) with a certain thickness determined by the relationship between the gravity and the specific gravity. The thickness of the liquid is the height of the contact angle.

In the thawing step and the drying step, the gap is provided in a relatively larger size between the portion of the liquid repellent 2a4 where the convex portion 2a4a does not exist, and the liquid repellent 2a5. For example, a gap of 10 mm or more is provided between the portion of the liquid repellent 2a4 where the convex portion 2a4a does not exist, and the liquid repellent 2a5.

In this way, the holder 2a1 does not come into direct contact with the surface of the stage 2a in the preliminary step, the liquid film forming step, and the cooling step, so that the holder 2a1 may be suppressed from being frozen and adhering to the stage 2a.

Even when the liquid 101 flows down from the substrate 100 toward the stage 2a along the holder 2a1 in the preliminary step or the liquid film forming step, the liquid repellent 2a4 may suppress the liquid 101 from reaching the surface of the stage 2a.

In this case, even when the liquid 101 flows into the gap between the holder 2a1 and the surface of the stage 2a, the liquid 101 may be suppressed from staying in the gap, since the gap of 5 mm or more is provided between the portion of the liquid repellent 2a4 where the convex portion 2a4a does not exist, and the liquid repellent 2a5. Thus, the liquid 101 may be suppressed from being frozen in the gap. Further, even when a 5 mm or less ice is formed on the surface of the stage 2a, the holder 2a1 and the stage 2a do not adhere to each other via the ice.

Further, the film-shaped liquid repellent 2a3 (corresponding to an example of the first (e.g., film-shape) liquid repellent) may be provided on the surface of the stage 2a and the surface of the holder 2a1 that faces the stage 2a, and the gap of 5 mm or more may be provided between the liquid repellent 2a3 provided on the surface of the stage 2a and the liquid repellent 2a3 provided on the surface of the holder 2a1, in the freeze-cleaning step.

While the embodiments of the present disclosure have been described, the present disclosure is not limited to the embodiments.

Those skilled in the art may make appropriate design changes to the foregoing embodiments, and the scope of the present disclosure includes the design changes as long as the design changes include the features of the present disclosure.

For example, the shapes, the dimensions, the number, and the arrangement of the respective components provided in the substrate processing apparatus 1 are not limited to the examples described herein, and may be appropriately changed.

For example, while the foregoing embodiments describe the coolant unit 3a that generates the cooling gas 3a1 by vaporizing the coolant, the coolant unit may cool a gas of room temperature through a chiller circulation.

For example, the thawing step may be performed before cracks are generated in the frozen film in the freezing step (solid phase).

For example, the thawing step may be performed after the freezing step (solid-liquid phase) without performing the freezing step (solid phase).

For example, in the thawing step and the drying step, the supply of the cooling gas may be maintained as long as the dew condensation does not occur on the substrate 100. In this case, the time for the freeze-cleaning process may be reduced.

For example, in the embodiment illustrated in FIG. 9, only the convex portion 2a5 may be provided without providing the convex portion 2a4a.

Further, the tip of the convex portions 2a4a and the tip of the convex portions 2a5 may partially overlap with each other in the height direction. In this case, when the height of the convex portion 2a5 is set to be equal to or more than the height of the contact angle between the liquid 101 and the surface of the stage 2a (e.g., 5 mm or more), and the overlapping length is set to be equal to more than the length of the contact angle, a labyrinth structure may be obtained. With the labyrinth structure, the liquid 101 may be suppressed from flowing into the gap between the holder 2a1 and the stage 2a. Thus, the holder 2a1 may be further suppressed from being frozen and adhering to the stage 2a.

For example, the shapes of the convex portions 2a4a and the convex portions 2a5 are not limited to the annular shape. For example, the convex portion 2a4a may have a dot shape or a wave shape. In this case, an annular portion is provided below the dot- or wave-shaped portion of the convex portion 2a5. The thickness of the annular portion may be 5 mm or more. Further, the dots of the convex portion 2a4a are provided to surround the peripheral edge of the liquid repellent 2a4. Further, each dot of the convex portion 2a5 may be disposed to be located in the gap formed between the dots of the convex portion 2a4a.

From the foregoing, it will be appreciated that various embodiments of the present disclosure have been described herein for purposes of illustration, and that various Modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
    a stage provided to be rotatable;
    a plurality of holders provided on one side of the stage and configured to hold a substrate;
    a liquid supply including a liquid nozzle configured to supply a liquid having a temperature higher than a freezing point of the liquid to a surface of the substrate opposite to the stage from the liquid nozzle;
    a cooler connected to a space between the stage and the substrate and configured to supply a cooling gas to the space;
    a mover connected to the plurality of holders through the stage and configured to change a distance between the stage and the substrate held by the plurality of holders; and
    a controller configured to control the cooler and the mover,
    wherein the controller is further configured to:
        perform a cooling process that at least includes a supercooling process for bringing the liquid on the substrate into a supercooled state from the temperature higher than the freezing point and a freezing process (solid-liquid phase) progressed from the supercooled state until a completion of a freezing of the liquid, and a thawing process after the cooling process,
        in the cooling process, control the mover to set the distance between the stage and the substrate to a first distance, and
        in the thawing process, control the mover to set the distance between the stage and the substrate to a second distance longer than the first distance.

2. The substrate processing apparatus according to claim 1, wherein the mover includes:
    a support provided with the plurality of holders, and
    a lift connected to the support by a repulsive force and configured to move the support up and down.

3. The substrate processing apparatus according to claim 2, wherein the support includes a first base having a magnetism, and the lift includes a second base that faces the first base and has a magnetism with a same polarity as that of the first base.

4. The substrate processing apparatus according to claim 3, further comprising:
    a film-shaped liquid repellent provided on at least one of a surface of the stage and a portion of each of the holders on a side of the stage, and configured to more easily repel the liquid than the stage.

5. The substrate processing apparatus according to claim 4, wherein when the film-shaped liquid repellent is provided on both the surface of the stage and the portion of each of the holders on the side of the stage, a gap of 5 mm or more is provided between the film-shaped liquid repellent provided on the surface of the stage and the film-shaped liquid repellent provided on the portion of each of the holders on the side of the stage.

6. The substrate processing apparatus according to claim 4, further comprising:
    a convex-shaped liquid repellent provided on the portion of each of the holders on the side of the stage, and configured to more easily repel the liquid than the stage.

7. The substrate processing apparatus according to claim 3, further comprising:
    a convex-shaped liquid repellent, provided on a portion of each of the holders on a side of the stage, and configured to more easily repel the liquid than the stage.

8. The substrate processing apparatus according to claim 3, further comprising:
    a plate-shaped liquid repellent provided on a surface of each of the holders on a side of the stage, and configured to more easily repel the liquid than the stage; and
    a convex-shaped liquid repellent provided on a surface of the stage to face the plate-shaped liquid repellent and configured to more easily repel the liquid than the stage,
    wherein the plate-shaped liquid repellent includes a convex portion on a surface thereof.

9. The substrate processing apparatus according to claim 1, further comprising:
    a film-shaped liquid repellent provided on at least one of a surface of the stage and a portion of each of the holders on a side of the stage, and configured to more easily repel the liquid than the stage.

10. The substrate processing apparatus according to claim 9, wherein when the film-shaped liquid repellent is provided on both the surface of the stage and the portion of each of the holders on the side of the stage, a gap of 5 mm or more is provided between the film-shaped liquid repellent provided on the surface of the stage and the film-shaped liquid repellent provided on the portion of each of the holders on the side of the stage.

11. The substrate processing apparatus according to claim 9, further comprising:
    a convex-shaped liquid repellent provided on the portion of each of the holders on the side of the stage, and configured to more easily repel the liquid than the stage.

12. The substrate processing apparatus according to claim 1, further comprising:
    a convex-shaped liquid repellent, provided on a portion of each of the holders on a side of the stage, and configured to more easily repel the liquid than the stage.

13. The substrate processing apparatus according to claim 1, further comprising:

a plate-shaped liquid repellent provided on a surface of each of the holders on a side of the stage, and configured to more easily repel the liquid than the stage; and a convex-shaped liquid repellent provided on a surface of the stage to face the plate-shaped liquid repellent, and configured to more easily repel the liquid than the stage, wherein the plate-shaped liquid repellent includes a convex portion on a surface thereof.

14. A substrate processing apparatus comprising:

a stage provided to be rotatable;

a plurality of holders provided on one side of the stage and configured to hold a substrate;

a liquid supply including a liquid nozzle configured to supply a liquid having a temperature higher than a freezing point of the liquid to a surface of the substrate opposite to the stage from the liquid nozzle;

a cooler connected to a space between the stage and the substrate and configured to supply a cooling gas to the space;

a mover connected to the plurality of holders through the stage and configured to change a distance between the stage and the substrate held by the plurality of holders; and a controller configured to control the cooler and the mover, wherein the controller is further configured to:

control the cooler to perform a switching between a first process of supplying the cooling gas and a second process of stopping the supply of the cooling gas, in the first process, control the mover to set the distance between the stage and the substrate to a first distance, and in the second process, control the mover to set the distance between the stage and the substrate to a second distance longer than the first distance.

* * * * *